(12) United States Patent
Suvorov

(10) Patent No.: US 7,547,897 B2
(45) Date of Patent: Jun. 16, 2009

(54) HIGH-TEMPERATURE ION IMPLANTATION APPARATUS AND METHODS OF FABRICATING SEMICONDUCTOR DEVICES USING HIGH-TEMPERATURE ION IMPLANTATION

(75) Inventor: Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 236 days.

(21) Appl. No.: 11/441,524

(22) Filed: May 26, 2006

(65) Prior Publication Data

US 2008/0067432 A1 Mar. 20, 2008

(51) Int. Cl.
*H01J 37/20* (2006.01)
*H01J 37/317* (2006.01)

(52) U.S. Cl. .............. 250/492.21; 250/443.1; 250/442.11; 16/422; 16/425; 294/27.1; 294/26

(58) Field of Classification Search ............ 250/492.21, 250/443.1, 442.11; 16/422, 425; 294/27.1, 294/26
See application file for complete search history.

(56) References Cited

U.S. PATENT DOCUMENTS

| | | | | |
|---|---|---|---|---|
| 3,156,591 A | * | 11/1964 | Hale et al. .................. 117/106 |
| 4,724,300 A | * | 2/1988 | Dearnaley .............. 219/121.35 |
| 4,836,733 A | * | 6/1989 | Hertel et al. ............. 414/744.5 |
| 4,987,407 A | * | 1/1991 | Lee ............................ 340/540 |
| 4,998,859 A | * | 3/1991 | Oshima et al. ............. 414/680 |
| 5,049,029 A | * | 9/1991 | Mitsui et al. ............ 414/744.5 |
| 5,156,461 A | * | 10/1992 | Moslehi et al. ............. 374/121 |
| 5,387,067 A | | 2/1995 | Grunes |
| 5,753,923 A | * | 5/1998 | Mera et al. ................ 250/443.1 |
| 5,907,158 A | * | 5/1999 | Nasser-Ghodsi et al. ...................... 250/492.21 |
| 6,025,602 A | * | 2/2000 | Rose et al. ............. 250/492.21 |
| 6,111,260 A | * | 8/2000 | Dawson et al. ......... 250/492.21 |
| 6,388,263 B1 | * | 5/2002 | Song ..................... 250/492.21 |
| 6,653,792 B2 | | 11/2003 | Joo |
| 6,933,511 B2 | * | 8/2005 | Yang et al. ............. 250/492.21 |

OTHER PUBLICATIONS

Schork et al. "Radiation-Enhanced Diffusion During High-Temperature Ion Implantation", *Nuclear Instruments and Methods in Physics Research* 59/60:499-503 (1991).

* cited by examiner

*Primary Examiner*—Jack I Berman
(74) *Attorney, Agent, or Firm*—Myers Bigel Sibley & Sajovec, P.A.

(57) ABSTRACT

A semiconductor device fabrication apparatus includes a load lock chamber, a loading assembly in the load lock chamber, and an ion implantation target chamber that is hermetically connected to the load lock chamber. The load lock chamber is configured to store a plurality of wafer plates. Each wafer plate respectively includes at least one semiconductor wafer thereon. The ion implantation target chamber is configured to implant an ion species into a semiconductor wafer on a currently loaded wafer plate. The loading assembly is also configured to load a next one of the plurality of wafer plates from the load lock chamber into the ion implantation target chamber. The loading assembly may be configured to load the next wafer plate from the load lock chamber into the ion implantation target chamber while substantially maintaining a current temperature within the ion implantation target chamber and/or without depressurizing the ion implantation target chamber. Related methods and devices are also discussed.

28 Claims, 8 Drawing Sheets

HIGH-TEMPERATURE ION IMPLANTATION APPARATUS AND METHODS OF FABRICATING SEMICONDUCTOR DEVICES USING HIGH-TEMPERATURE ION IMPLANTATION

FIELD OF THE INVENTION

The present invention relates to semiconductor devices, and, more particularly, to ion implantation apparatus for fabricating semiconductor devices and related methods.

BACKGROUND OF THE INVENTION

Ion implantation is a semiconductor device fabrication technique that may be used to change the electronic properties of a semiconductor wafer by adding specific dopants to the wafer. More particularly, in conventional ion implantation, a desired ion species to be implanted into the wafer may be ionized, accelerated to a predetermined kinetic energy, and directed as an ion beam towards the surface of a semiconductor wafer loaded in an ion implantation target chamber. Based on the predetermined kinetic energy, the desired ion species may penetrate into the semiconductor wafer to a certain depth. As such, ions may be embedded (i.e., implanted) into the semiconductor wafer, which may thereby alter the electrical properties of the semiconductor wafer.

In some materials, ion implantation at relatively high temperatures (for example, up to 1800° C.) may provide several advantages, such as damage recovery, structure modification, increased chemical reaction, and/or enhanced diffusion of the implanted element. For example, high-temperature ion implantation into a silicon carbide (SiC) substrate may provide improved activation efficiency of the implanted species, lower sheet resistance of the implanted layer, higher carrier mobility, and/or reduced damage to the silicon carbide substrate as compared to ion implantation at room temperature. As ion implantation is typically performed in a vacuum, several methods have been used to provide the relatively high temperatures. For instance, resistive heaters, such as tungsten wire and/or graphite film, may be used to provide such increased temperatures in an ion implantation target chamber. Also, tungsten lamps may be used to increase temperatures in the ion implantation target chamber.

In conventional semiconductor wafer manufacturing, the semiconductor wafers may be stored on wafer holding plates in a load lock chamber adjacent to the ion implantation chamber. Each wafer holding plate may be individually loaded from the load lock chamber into the ion implantation chamber for ion implantation into the semiconductor wafer(s) thereon, and may be unloaded back into the load lock chamber when the ion implantation is completed. As such, it may be necessary to open the ion implantation target chamber to unload the current wafer plate and load the next wafer plate into the chamber. More particularly, the chamber pressure and temperature may be ramped down to unload the current wafer plate and load the next wafer plate, then ramped back up to a desired pressure and/or temperature for implantation into the semiconductor wafer on the next wafer plate. This may be a time-consuming process, which may affect throughput time for the ion implantation system.

Also, in conventional ion implantation systems, quartz wafer holding plates may be used to hold the semiconductor wafers for ion implantation at relatively high temperatures. The semiconductor wafers may be attached to quartz wafer holding plates by clips created from quartz rods. However, the quartz clips may be attached to the quartz plate by melting the quartz plate, which may result in warping of the quartz plate. The quartz clips may also mask a significant area of the semiconductor wafer to be implanted.

SUMMARY OF THE INVENTION

According to some embodiments of the present invention, a semiconductor device fabrication apparatus includes a load lock chamber, a loading assembly in the load lock chamber, and an ion implantation target chamber that is hermetically connected to the load lock chamber. The load lock chamber is configured to store a plurality of wafer plates. Each wafer plate respectively includes at least one semiconductor wafer thereon. The ion implantation target chamber is configured to implant an ion species into a semiconductor wafer on one of the plurality of wafer plates that is currently loaded therein. The loading assembly is also configured to load a next one of the plurality of wafer plates from the load lock chamber into the ion implantation target chamber. For example, the loading assembly may be configured to load the next one of the plurality of wafer plates from the load lock chamber into the ion implantation target chamber while substantially maintaining a current temperature of a reference point within the ion implantation target chamber. Also, the loading assembly may be configured to load the next one of the plurality of wafer plates without depressurizing the ion implantation target chamber.

In some embodiments, the loading assembly may be further configured to unload the currently loaded one of the plurality of wafer plates from the ion implantation target chamber into the load lock chamber while substantially maintaining a temperature and/or pressure of the ion implantation target chamber. The loading assembly may be configured to unload the currently loaded one of the plurality of wafer plates responsive to implantation of the ion species into the semiconductor wafer thereon.

In other embodiments, the ion implantation target chamber may be configured to implant a first desired ion species into the semiconductor wafer of the currently loaded one of the wafer plates. In addition, the ion implantation target chamber may be configured to implant a second desired ion species into a semiconductor wafer on the next one of the plurality of wafer plates responsive to loading the next one of the plurality of wafer plates therein.

In some embodiments, the semiconductor device fabrication apparatus may also include a cassette in the load lock chamber configured to hold the plurality of wafer plates. More particularly, the cassette may include a plurality of grooves configured to hold respective ones of the plurality of wafer plates. The plurality of grooves may be coated with a reduced friction surface configured to facilitate loading and/or unloading of the plurality of wafer plates from the cassette.

In other embodiments, the semiconductor device fabrication apparatus may further include a cassette advancing assembly in the load lock chamber. The cassette advancing assembly may be configured to consecutively provide the plurality of wafer plates to the loading assembly. More particularly, the cassette advancing assembly may include a cassette movement arm configured to move the cassette along a first axis to provide a next one of the plurality of wafer plates to the loading assembly. In addition, the loading assembly may include an elongated loading arm. The elongated loading arm may be configured to move along a second axis generally perpendicular to the first axis to load the next one of the plurality of wafer plates from the load lock chamber into the ion implantation target chamber.

In some embodiments, the load lock chamber may include a first elongated portion configured to house the elongated loading arm and a second elongated portion configured to house the cassette movement arm. At least one magnet outside the load lock chamber adjacent the first and/or second elongated portions thereof may be configured to magnetically actuate the elongated loading arm and/or the cassette movement arm to allow movement thereof without depressurizing the ion implantation target chamber.

In some embodiments, the load lock chamber may be configured to allow pre-heating of at least the next one of the plurality of wafer plates therein based on a current temperature of the ion implantation target chamber. For example, the load lock chamber may include a heating element therein configured to pre-heat one or more of the plurality of wafer plates.

In other embodiments, at least one of the plurality of wafer plates may include an opening extending therethrough beneath the at least one semiconductor wafer thereon. The opening may have at least one dimension smaller than that of the at least one semiconductor wafer. In addition, the ion implantation target chamber may include a heating element configured to heat a semiconductor wafer on one of the plurality of wafer plates currently loaded therein through the opening in the one of the plurality of wafer plates.

In some embodiments, the at least one of the plurality of wafer plates may further include a plurality of holes adjacent a perimeter of the opening therein, and a plurality of wire clips respectively extending from ones of the plurality of holes. The plurality of wire clips may be configured to removably attach the at least one semiconductor wafer to the wafer plate adjacent to the opening.

In other embodiments, the loading assembly may include an elongated arm having a key extending therefrom, and the at least one of the plurality of wafer plates may include a key hole at one end thereof that is adapted to matably interface with the key of the loading assembly. As such, the elongated arm of the loading assembly may be rotatable to lock the key extending therefrom into the key hole to secure the at least one of the plurality of wafer plates to the elongated arm. This may facilitate loading the at least one of the plurality of wafer plates into the ion implantation target chamber.

In some embodiments, the semiconductor device fabrication apparatus may also include a window on a wall of the ion implantation target chamber. The window may have a transparency sufficient to allow measurement of a thermal emissivity of a semiconductor wafer on the currently loaded one of the plurality of wafer plates in the ion implantation target chamber. For example, the window may be formed of calcium fluoride ($CaF_2$) having a transparency with respect to infrared light in a range of up to about an 8 micron wavelength.

According to other embodiments of the present invention, a semiconductor device fabrication apparatus includes a wafer holding plate configured to hold a semiconductor wafer thereon, and a plurality of clips removably attached to the wafer holding plate. The plurality of clips are configured to removably attach the semiconductor wafer to the wafer holding plate.

In some embodiments, the wafer holding plate may include a plurality of holes therein adjacent a perimeter of the semiconductor wafer thereon. The plurality of clips may respectively extend from ones of the plurality of holes. The wafer holding plate may be formed of a first material, while the plurality of clips may be formed of a second material having a greater flexibility than the first material. For example, the wafer holding plate may a quartz plate, and the plurality of clips may be tantalum (Ta) wire clips.

In other embodiments, the plurality of clips may be sized and configured to reduce thermal contact and/or chemical reaction with the semiconductor wafer. For example, the plurality of clips may be a plurality of wire clips having a diameter of less than about 0.5 mm. In addition, the plurality of holes may include at least two holes for each of the plurality of clips, and the plurality of wire clips may be respectively configured to be threaded through the at least two holes to secure the plurality of wire clips to the wafer holding plate.

In some embodiments, the plurality of holes may include first and second holes adjacent a circumference of the semiconductor wafer. The first and second holes may be separated by less than about 180 degrees relative to a center of the semiconductor wafer.

In other embodiments, the plurality of holes may include first, second, and third holes adjacent a circumference of the semiconductor wafer. The first and second holes may be separated by about 180 degrees relative to a center of the semiconductor wafer. The third hole may be between the first and second holes, and may be respectively separated therefrom by about 90 degrees relative to the center of the semiconductor wafer.

In some embodiments, the wafer holding plate may further include an opening extending therethrough beneath the semiconductor wafer. The opening may have at least one dimension smaller than that of the semiconductor wafer. The opening in the wafer holding plate may be sized and configured to allow direct heating of the semiconductor wafer therethrough. For example, the opening in the wafer holding plate may have a diameter that is less than but substantially similar to a diameter of the semiconductor wafer.

In other embodiments, the wafer holding plate may include a key hole at one end thereof. The key hole may be adapted to matably interface with a loading assembly that is configured to load the wafer holding plate into an ion implantation target chamber.

According to further embodiments of the present invention, a method of fabricating a semiconductor device includes loading one of a plurality of wafer plates from a load lock chamber into an ion implantation target chamber as hermetically connected to the load lock chamber. The plurality of wafer plates respectively includes at least one semiconductor wafer thereon. A desired ion species is implanted into at least one semiconductor wafer on the currently loaded one of the plurality of wafer plates in the ion implantation target chamber at a desired temperature and/or pressure. A next one of the plurality of wafer plates is loaded from the load lock chamber into the ion implantation target chamber responsive to implanting the desired ion species. For example, the next one of the plurality of wafer plates may be loaded while substantially maintaining a current temperature of a reference point within the ion implantation target chamber. Also, the next one of the plurality of wafer plates may be loaded without depressurizing the ion implantation target chamber.

In some embodiments, the currently loaded one of the plurality of wafer plates may be unloaded from the ion implantation target chamber into the load lock chamber responsive to implanting the desired ion species therein. The currently loaded one of the plurality of wafer plates may be unloaded while substantially maintaining the current temperature and/or pressure of the ion implantation target chamber.

In other embodiments, a first desired ion species may be implanted into the semiconductor wafer on the currently loaded one of the plurality of wafer plates. A second desired ion species may be implanted into a semiconductor wafer on the next one of the plurality of wafer plates responsive to loading the next one of the plurality of wafer plates into the ion implantation target chamber.

In some embodiments, the next one of the plurality of wafers in the load lock chamber may be pre-heated prior to loading the next one of the plurality of wafer plates into the ion implantation target chamber.

In other embodiments, the semiconductor wafer on the currently loaded one of the plurality of wafer plates in the ion implantation target chamber may be heated through an opening in the currently loaded one of the plurality of wafer plates. The opening may be beneath at least one semiconductor wafer on the currently loaded one of the plurality of wafer plates.

In some embodiments, a thermal emissivity of a semiconductor wafer on the currently loaded one of the plurality of wafer plates may be measured through a calcium fluoride ($CaF_2$) window in the ion implantation target chamber. The measured thermal emissivity may be correlated to a current surface temperature of the semiconductor wafer.

These and other features of the present invention will become more readily apparent to those skilled in the art upon consideration of the following detailed description and accompanying drawings, which describe both preferred and alternative embodiments of the present invention.

DETAILED DESCRIPTION OF EMBODIMENTS OF THE INVENTION

Figure 1A:
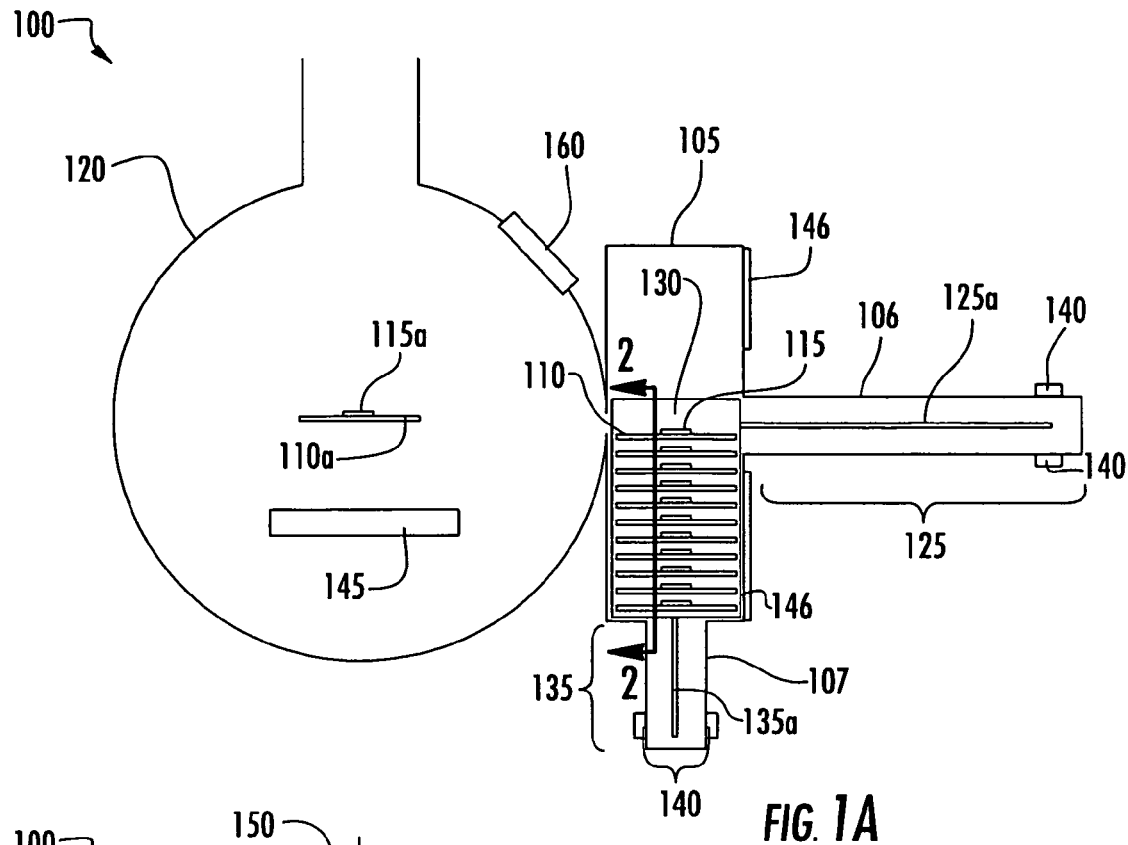
FIGS. 1A-1D are schematic illustrations of apparatus and methods for fabricating semiconductor devices using high-temperature ion implantation according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Some embodiments of the present invention arise from a realization that, from a manufacturing point of view, having to ramp down temperature and/or pressure of an ion implantation target chamber between loading and unloading of wafer holding plates may be a limiting factor on throughput of the ion implantation process. Accordingly, embodiments of the present invention can provide a high-temperature stage for ion implantation with the ability to consecutively load semiconductor wafers into the ion implantation target chamber without opening the target chamber. As such, semiconductor wafers can be loaded into the ion implantation target chamber without ramping down the pressure and/or temperature of the chamber between the loading of each wafer. In other words, embodiments of the present invention can provide the ability to load a next wafer in the high temperature stage immediately after implantation of the previous wafer, without cooling of the wafer and/or venting of the ion implantation target chamber. Accordingly, throughput of the ion implanters may be improved. More particularly, throughput of the ion implanters for high temperature implants may be increased by four to ten times according to some embodiments of the present invention.

FIGS. 1A-1D illustrate exemplary apparatus and methods for high temperature ion implantation according to some embodiments of the present invention. Referring now to FIG. 1A, a high-temperature ion implantation apparatus 100 includes a load lock chamber 105, an ion implantation target chamber 120 that is hermetically connected to the load lock chamber 105, and a loading assembly 125 in the load lock chamber 105. The load lock chamber 105 is configured to store a plurality of wafer plates 110 therein. Each of the wafer plates 110 includes at least one semiconductor wafer 115 thereon. The load lock chamber 105 may also be configured to store a cassette 130 that is configured to hold the plurality of wafer plates 110.

Figure 1B:
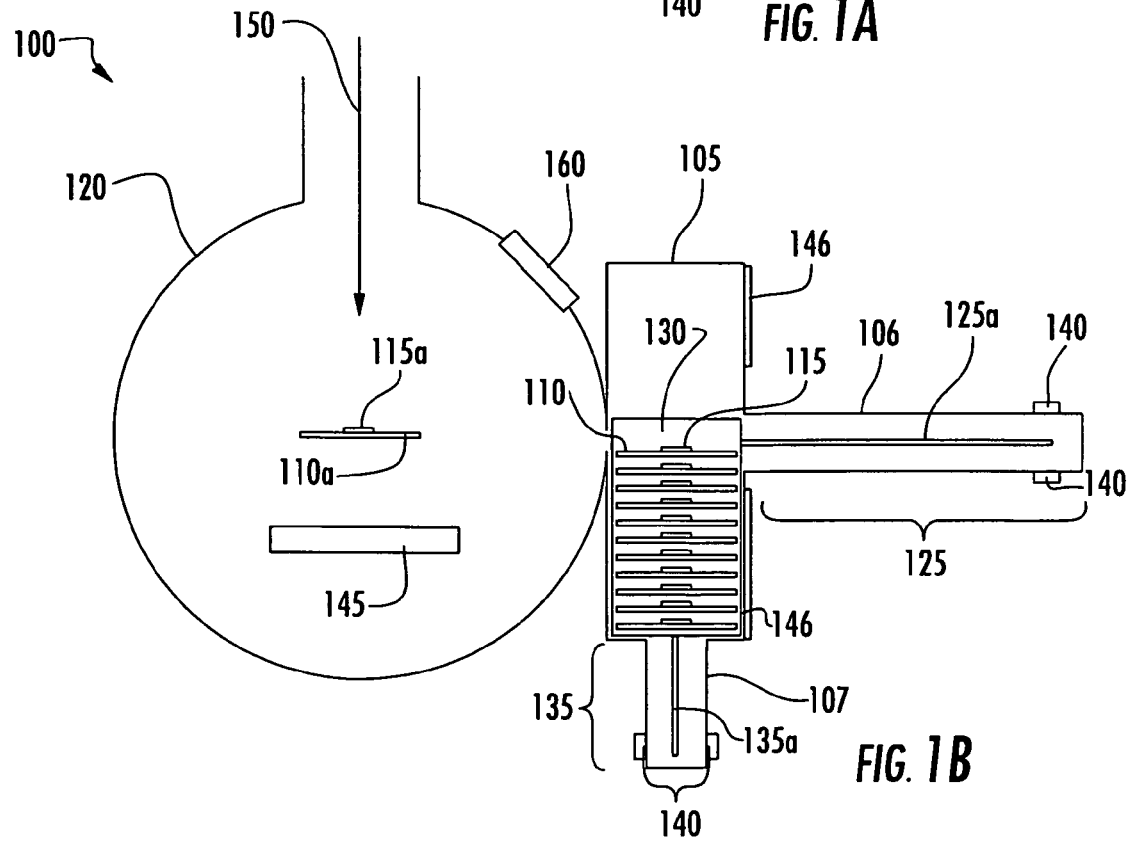

As shown in FIG. 1B, the ion implantation target chamber 120 is configured to implant a desired ion species 150 into a semiconductor wafer 115a on a currently loaded one 110a of the wafer plates 110 at a desired temperature and/or pressure. More particularly, the ion implantation target chamber 120 may be depressurized to a vacuum, and may include a heating element 145 that is configured to provide a desired temperature based on the composition of the currently loaded semiconductor wafer 115a and/or the particular ion species to be implanted. For example, the heating element 145 may be an infrared or quartz lamp that is configured to heat wafers inside the ion implantation target chamber 120 without vacuum interruption. In addition, the currently loaded wafer plate 110a may include an opening (not shown) extending therethrough beneath the semiconductor wafer 115a. The opening may have at least one dimension smaller than the semiconductor wafer 115a to allow for heating of the semiconductor wafer 115a through the opening in the wafer plate 110a. In some embodiments, the heating element 145 may be configured to heat the semiconductor wafer 115a on the currently loaded wafer plate 110a through the opening in the wafer plate 110a to facilitate ion implantation, as will be further described below with reference to FIGS. 5A-5C.

The load lock chamber 105 may also be configured to allow pre-heating of one or more of the wafer plates 110 stored therein via the connection to the ion implantation target chamber 120. For example, a next one of the plurality of wafer plates 110 may be pre-heated by infrared radiation emitted from the heating element 145. In addition, the load lock chamber 105 may include a heating element 146 that is configured to pre-heat one or more of the wafer plates 110 stored inside the load lock chamber 105 prior to loading the wafer plates 110 into the ion implantation target chamber 120 to reduce and/or avoid thermal shock. For example, the wafer plates 110 in the load lock chamber 105 may be pre-heated to a temperature above room temperature, but below the temperature of the currently loaded wafer plate 110a. In some instances, a pre-heated wafer plate may be loaded into the ion implantation target chamber 120 without deactivating the heating element 145 during the loading/unloading process. The heating element 146 in the load look chamber 105 may be a resistive heater, such as tungsten wire and/or graphite film.

Figure 1C:
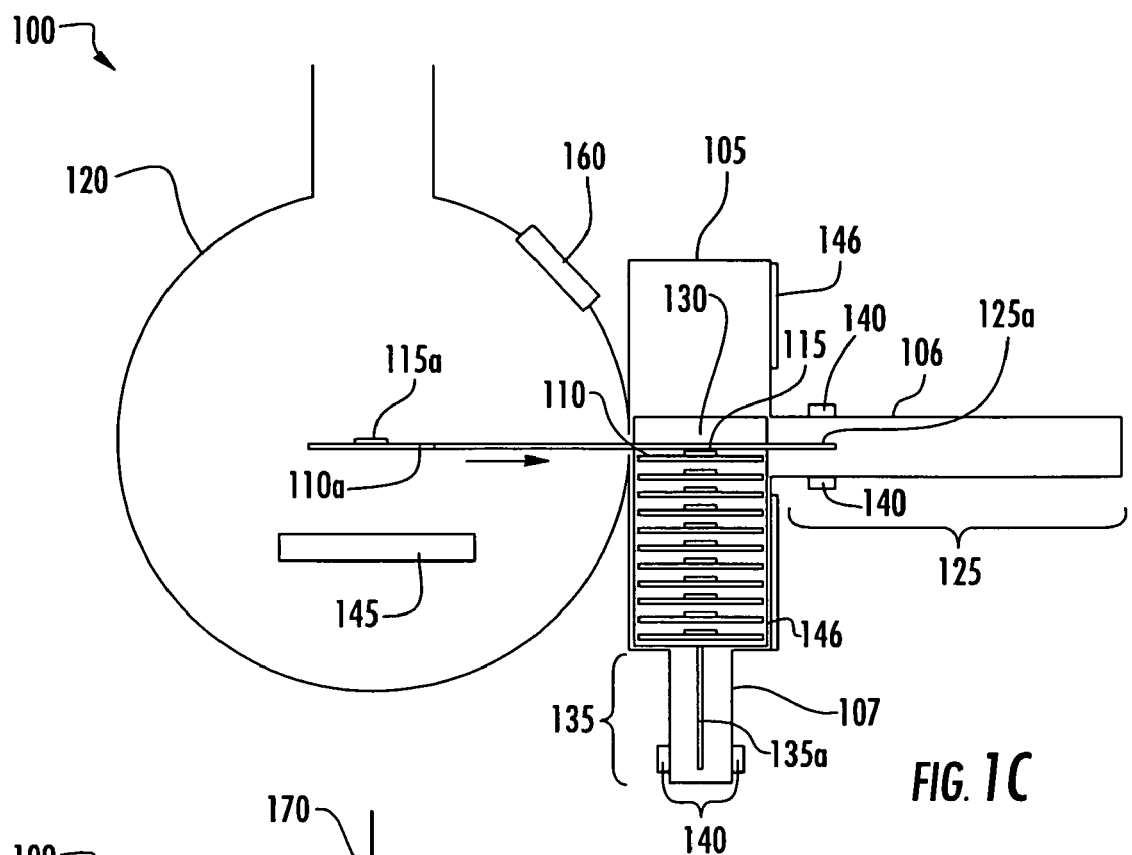

Referring now to FIG. 1C, the loading assembly 125 is configured to load a next one of the wafer plates 110 from the load lock chamber 105 into the ion implantation target chamber 120. More particularly, the loading assembly 125 is configured to unload the currently loaded wafer plate 110a from the ion implantation target chamber 120 into the load lock chamber 105 responsive to implantation of the ion species 150 into the currently loaded semiconductor wafer 115a in the ion implantation chamber 120. The loading assembly 125 is configured to unload the currently loaded wafer plate 110a while substantially maintaining the temperature and/or pressure within the ion implantation target chamber 120. More specifically, the loading assembly 125 includes an elongated loading arm 125a that is configured to unload the currently loaded wafer plate 110a from the ion implantation target chamber 120 back into the cassette 130 in the load lock chamber 105. The elongated loading arm 125a of the loading assembly 125 is also configured to load a next one 110d of the wafer plates 110 from the cassette 130 in the load lock chamber 105 into the ion implantation target chamber 120.

Figure 1D:
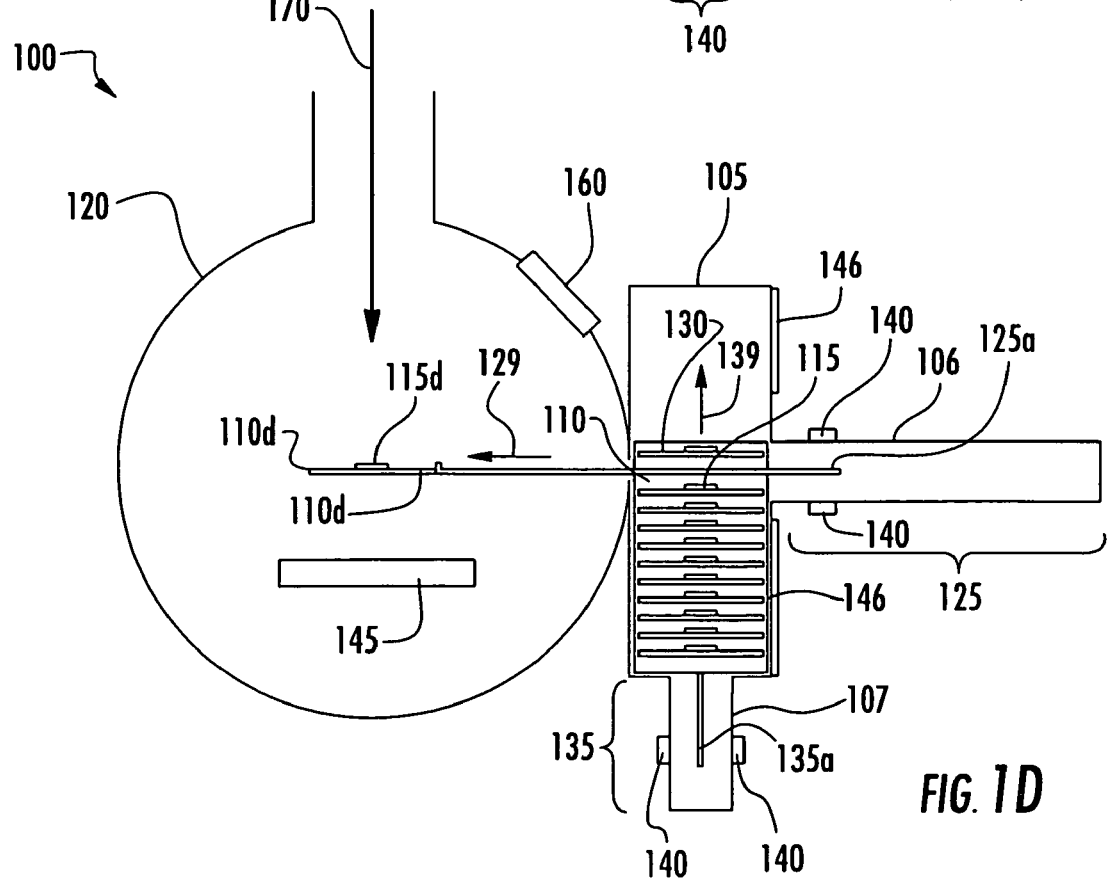

More particularly, as shown in FIG. 1D, a cassette advancing assembly 135 in the load lock chamber 105 is configured to consecutively present the wafer plates 110 in the cassette 130 to the loading assembly 125. The cassette advancing assembly 135 includes a cassette movement arm 135a that is configured to move the cassette along a first axis 139 to present the next one 110d of the wafer plates 110 to the loading assembly 125. The elongated loading arm 125a of the loading assembly 125 is configured to move along a second axis 129 that is generally perpendicular to the first axis 139 to load the next wafer plate 110d from the cassette 130 in the load lock chamber 105 into the ion implantation target chamber 120. Responsive to loading the next wafer plate 110d, an ion species 170 is implanted into the semiconductor wafer 115d thereon.

The loading assembly 125 is configured to load the next wafer plate 110d from the cassette 130 in the load lock chamber 105 into the ion implantation target chamber 120 without depressurizing the ion implantation target chamber 120. For example, the next wafer plate 110d may be loaded from the load lock chamber 105 into the ion implantation target chamber 120 without vacuum interruption. As such, the temperature of a given reference point within the target chamber 120 may also be substantially maintained. In other words, as the next wafer plate 110d may be loaded without opening the ion implantation target chamber 120, there may be relatively little variation in the temperature and/or pressure within the chamber 120 during the loading/unloading process.

For example, still referring to FIG. 1D, the load lock chamber 105 may include a first elongated portion 106 that is configured to house the elongated loading arm 125a of the loading assembly 125, and a second elongated portion 107 that is configured to house the cassette movement arm 135a of the cassette advancing assembly 135. One or more magnetic manipulators 140 may be located outside the load lock chamber 105 adjacent the first elongated portion 106 and/or the second elongated portion 107. The magnetic manipulators 140 may be configured to magnetically actuate the elongated loading arm 125a of the loading assembly 125 and/or the cassette movement arm 135a of the cassette advancing assembly 135 to induce movement thereof without depressurizing the ion implantation target chamber 120.

Accordingly, the wafer plates 110 including the semiconductor wafers 115 thereon may be loaded sequentially (or in any specified order) from the load lock chamber 105 into the ion implantation target chamber 120 hermetically connected to the load lock chamber 105 without cooling and/or venting the ion implantation target chamber 120. As such, the temperature and pressure within the ion implantation target chamber 120 may be substantially maintained, and the next semiconductor wafer 115d on the next wafer plate 110d may be consecutively loaded and implanted immediately after implantation of the currently loaded semiconductor wafer 115a on the currently loaded wafer plate 110a. Thus, throughput of the apparatus 100 according to some embodiments of the present invention may be increased relative to that of conventional apparatus, some of which may require 20 minutes or more between loading of each wafer plate to restore the desired temperature and/or pressure.

As further illustrated in FIGS. 1A-1D, the ion implantation target chamber 120 may be configured to implant a first desired ion species 150 into the semiconductor wafer 115a on the currently loaded wafer plate 110a, and to implant a second desired ion species 170 into the semiconductor wafer 115d on the next wafer plate 110d. For example, n-type ions may be implanted into the wafer 115a to form an n-type device, while p-type ions may be implanted into the semiconductor wafer 115d to form a p-type device. Also, both n-type and p-type ions may be implanted into the same wafer. In addition, the implant conditions in the ion implantation target chamber 120 may be adjusted based on the composition of the currently loaded wafer and/or the desired ion species to be implanted. In other words, the first desired ion species 150 may be implanted into the wafer 115a at a first temperature and/or pressure, while the second desired ion species 170 may be implanted into the wafer 115d at a second temperature and/or pressure that is different from the first. Also, because the load lock chamber 105 and the ion implantation target chamber 120 are hermetically connected, the temperature and/or pressure may be adjusted during unloading of the currently loaded wafer plate 110a and/or during loading of the next wafer plate 110d into the ion implantation target chamber.

In addition, the ion implantation target chamber 120 may include a window 160 on a wall of the ion implantation target chamber 120. The window 160 may have a transparency that is sufficient to allow measurement of a thermal emissivity of a semiconductor wafer on a wafer plate in the ion implantation target chamber 120, such as the semiconductor wafer 115d on the wafer plate 110d. For example, the window 160 may be a calcium fluoride ($CaF_2$) window having a transparency with respect to infrared light in a range of up to about an 8 micron wavelength. The measured thermal emissivity of the semiconductor wafer may be directly correlated to a current surface temperature of the semiconductor wafer. For example, during the ion implantation process, the ion beam may heat the surface of the semiconductor wafer, thereby changing the surface temperature to greater than a desired and/or optimal temperature for implantation. Accordingly, based on the measured thermal emissivity of the semiconductor wafer through the window 160 during ion implantation, the surface temperature of the wafer may be directly determined and adjusted in real time. For example, the heating element 145 in the ion implantation target chamber 120 may be adjusted in real time to account for the changes in the surface temperature of the wafer, which may facilitate ion implantation into the semiconductor wafer and/or allow for optimization of ion implantation conditions.

Although FIGS. 1A to 1D illustrate exemplary apparatus and methods for high-temperature ion implantation according to some embodiments of the present invention, it will be understood that the present invention is not limited to such configurations, but is intended to encompass any configuration capable of carrying out the operations described herein. For example, in place of the cassette 130, the plurality of wafer plates could be stored on a rotating wheel that is configured to consecutively load the plurality of wafer plates into the ion implantation target chamber 120.

Figure 2A:
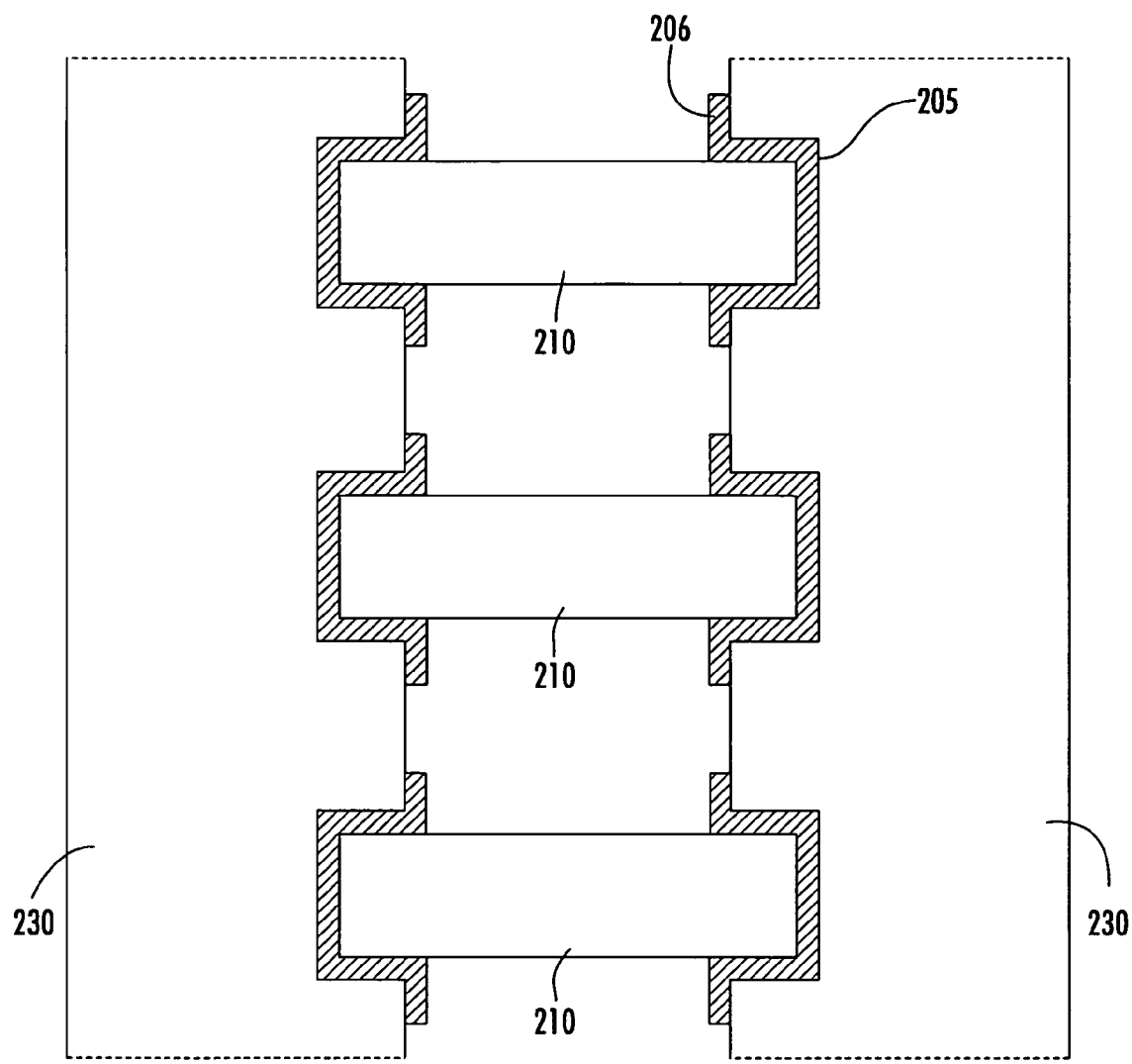
FIG. 2A is a cross-sectional view taken along line 2-2' of FIG. 1A illustrating a cassette in an apparatus for fabricating semiconductor devices using high-temperature ion implantation according to some embodiments of the present invention.

FIG. 2A is a cross-sectional view taken along line 2-2' of FIG. 1A illustrating a cassette 230 configured to hold a plurality of wafer plates 210 according to some embodiments of the present invention. The cassette 230 and the wafer plates 210 may respectively correspond to the cassette 130 and the wafer plates 110 illustrated in FIGS. 1A-1D. As shown in FIG. 2A, the cassette 230 includes a plurality of grooves 205 configured to hold respective ones of the plurality of wafer plates 210. The grooves 205 are coated with a reduced-friction surface 206 that is configured to facilitate loading and/or unloading of the wafer plates 210 from the cassette 230. For example, the reduced-friction surface 206 may be Teflon® polymer and/or other low-friction materials as are well-known in the art. As such, the grooves 205 may allow the wafer plates 210 to be slidably advanced from the cassette 230 into an ion implantation target chamber, such as the ion implantation target chamber 120 of FIGS. 1A-1D. Likewise, the grooves 205 may allow a currently loaded wafer plate to be slidably retracted back into the cassette 230 from the ion implantation target chamber by a loading assembly, such as the loading assembly 125 of FIGS. 1A-1D.

Figure 2B:
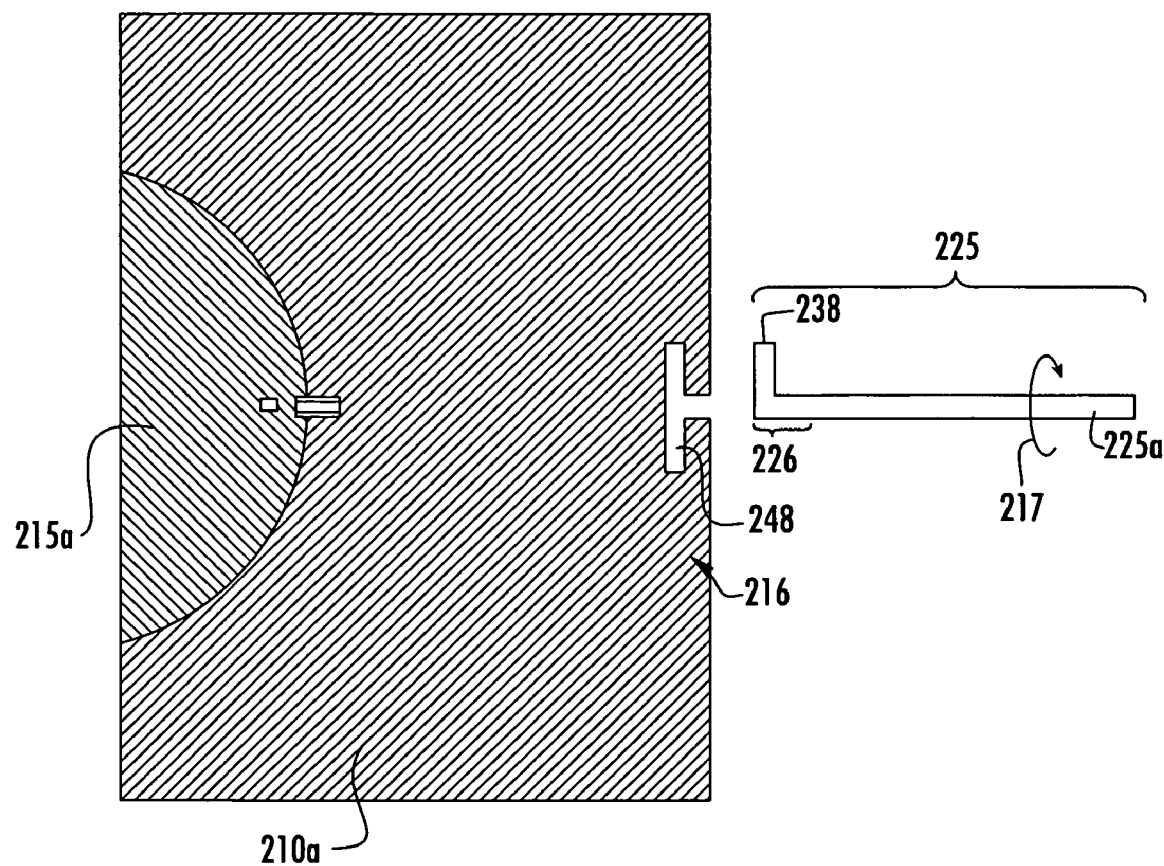
FIG. 2B is an enlarged plan view illustrating a wafer plate and an elongated loading arm for loading the wafer plate into an ion implantation target chamber in an apparatus for fabricating semiconductor devices using high-temperature ion implantation according to some embodiments of the present invention.

FIG. 2B is a plan view further illustrating a wafer plate 210a and a loading assembly 225 for loading and/or unloading of the wafer plate 210a according to some embodiments of the present invention. The loading assembly 225 may correspond to the loading assembly 125 of FIGS. 1A-1D, while the wafer plate 210a may correspond to one of the plurality of wafer plates 110 of FIGS. 1A-1D. Referring now to FIG. 2B, an end of the loading assembly 225 is adapted to matably interface with one end of the wafer holding plate 210a. More particularly, the loading assembly 225 includes an elongated arm 225a having a key 238 extending from the end 226 of the elongated arm 225a. The wafer plate 210a includes a keyhole 248 at one end 216 thereof that is adapted to matably interface with the key 238 of the loading assembly 225. The key 238 and/or the keyhole 248 may also be coated with a reduced friction surface, such as Teflon® polymer and/or other low-friction materials.

Still referring to FIG. 2B, the elongated arm 225a of the loading assembly 225 is rotatable along its long axis (as shown by arrow 217) to "lock" the key 238 into the keyhole 248 in the wafer plate 210a. As such, the wafer plate 210a may be secured to the elongated arm 225 to facilitate loading of the wafer plate 210a from a storage cassette in a load lock chamber into the ion implantation target chamber. After loading the wafer plate 210a into the ion implantation target chamber, the elongated arm 225a may be rotated to unlock the key 238 from the keyhole 248 in the wafer plate 210a, allowing the elongated arm 225a to be retracted back into the load lock chamber so that ion implantation may be performed on the semiconductor wafer 215a on the wafer plate 210a. After ion implantation, the elongated arm 225a may be extended back into the ion implantation target chamber, where the key 238 extending from the end 226 of the arm 225a may be again inserted and locked in the keyhole 248 to facilitate unloading of the wafer plate 210a from the ion implantation target chamber back into the storage cassette in the load lock chamber. The elongated arm 225a may not remain attached to the wafer plate 210a in the ion implantation target chamber during ion implantation of the semiconductor wafer 215a. Thus, the loading and/or unloading of the wafer plate 210a to and/or from the ion implantation target chamber may be performed while substantially maintaining the pressure and/or temperature of the ion implantation target chamber, as described above with reference to FIGS. 1A-1D.

In some embodiments, the key 238 may be locked in the keyhole 248 only during unloading of the wafer plate 210a. In other words, during loading of the wafer plate 210, the key 238 may be inserted into the keyhole 248 but may not be rotated or locked in the keyhole 248, such that the elongated arm 225a may push the wafer plate 210a into the ion implantation target chamber without being secured to the wafer plate 210a. As such, the distance between the grooves 205 holding adjacent wafer plates in the cassette 230 of FIG. 2A may be limited based on the shape of the key 238, such that the key 238 may be extended and/or retracted therebetween regardless of the current angle of rotation along its long axis. Also, although illustrated in FIG. 2B as an "L"-shaped key 238 and a "T"-shaped keyhole 248, it is to be understood that any matably-compatible combination of shapes for the key 238 and/or keyhole 248 may be utilized to secure the wafer plate 210a to the loading assembly 225.

Figure 3A:
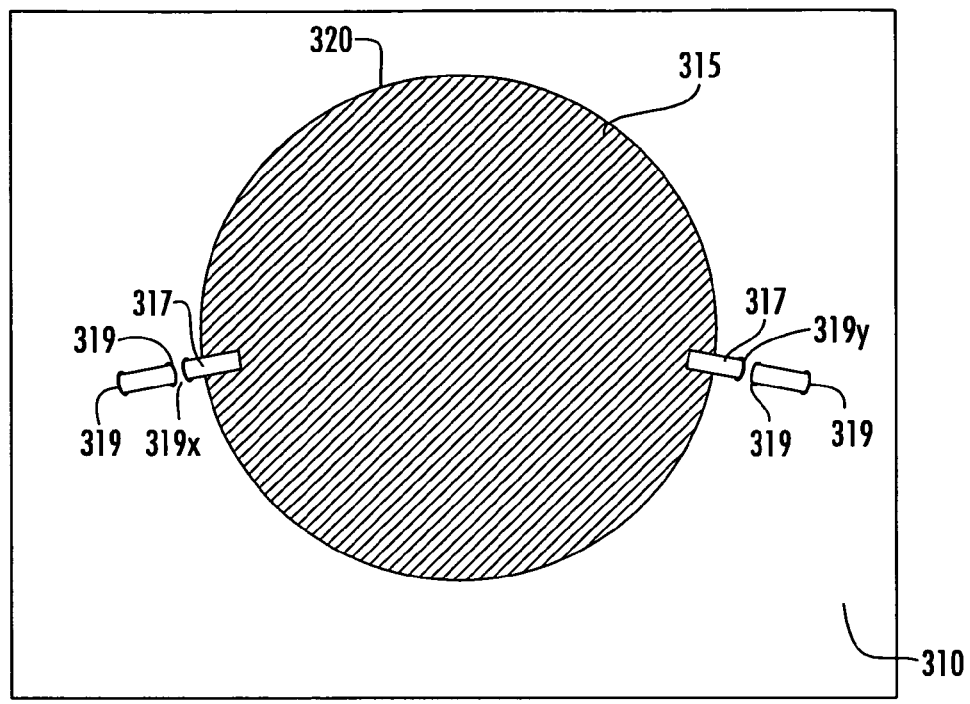
FIG. 3A is a plan view of a wafer holding plate according to some embodiments of the present invention.
Figure 3B:
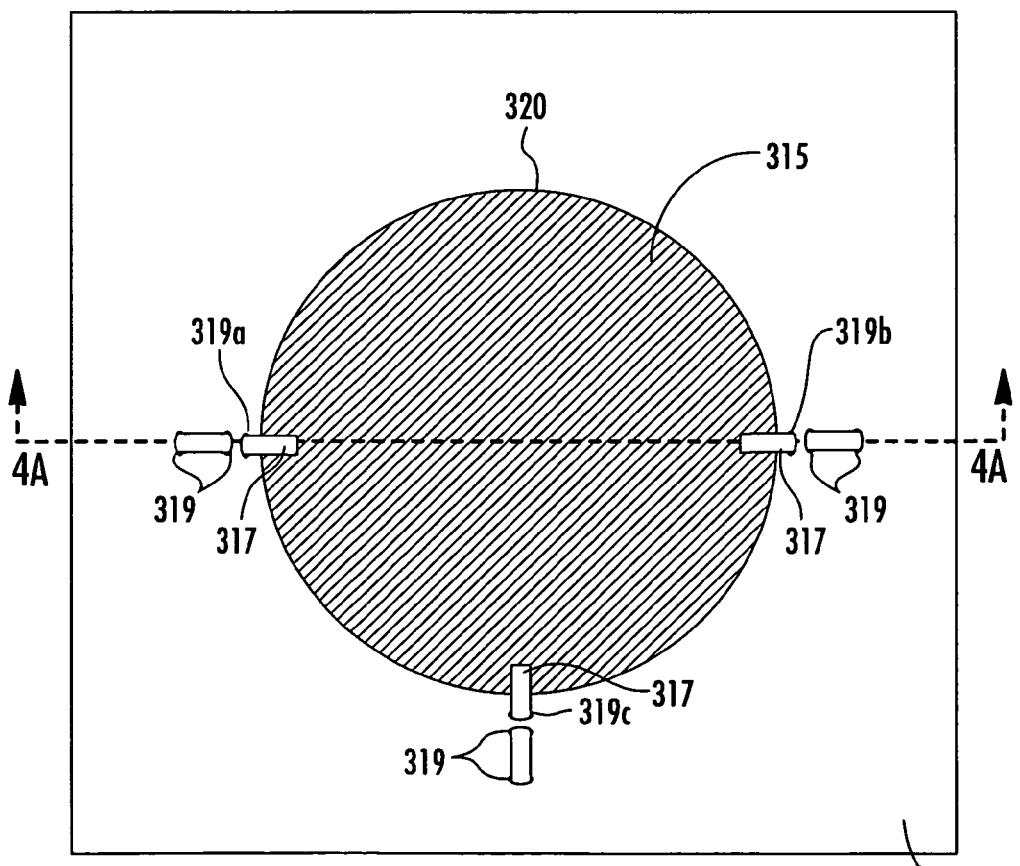
FIG. 3B is a plan view of a wafer holding plate according to further embodiments of the present invention.

FIGS. 3A and 3B are plan views illustrating a wafer holding plate 310 which may be used in fabricating semiconductor devices according to some embodiments of the present invention. In some embodiments, the wafer holding plate 310 may correspond to one of the plurality of wafer plates 110 illustrated in FIGS. 1A-1D. Referring now to FIG. 3A, the wafer holding plate 310 is configured to hold at least one semiconductor wafer 315 thereon. More particularly, the wafer holding plate 310 includes a plurality of clips 317 that are removably attached to the wafer holding plate 310. The clips 317 are configured to removably attach the semiconductor wafer 315 to the wafer holding plate 310. For example, the clips 317 may extend from a plurality of holes 319 in the wafer holding plate 310 adjacent the perimeter 320 of the semiconductor wafer 315 to releasably secure the wafer 315 to the wafer holding plate 310. In addition, the clips 317 may be secured around ends of the wafer holding plate 310 and may extend to beyond the perimeter of the semiconductor wafer 315 to removably clamp the wafer 315 to the wafer holding plate 310.

The wafer holding plate 310 may be formed of a first material, while the clips 317 may be formed of a second material having a greater flexibility than the first material. For example, the wafer holding plate 310 may be made of quartz, while the clips 317 may be formed of tantalum (Ta). In addition to being inherently flexible, tantalum (Ta) also has a relatively high melting point (approximately 3000° C.), which may be suitable for high-temperature ion implantation according to embodiments of the present invention. As such, the clips 317 may be configured to withstand the relatively high temperatures of the ion implantation process. Also, where the wafer holding plate 310 includes a plurality of holes 319 adjacent the perimeter 320 of the semiconductor wafer 315, the clips 317 may be sufficiently flexible to be threaded through the holes 319 to secure the semiconductor wafer 315 to the wafer holding plate 310. The clips 317 may be sized and configured to reduce thermal contact and/or chemical reaction with the semiconductor wafer 315. For example, where the semiconductor wafer 315 is a silicon carbide wafer (SiC), the clips 317 may be formed of tantalum (Ta) to avoid chemical reaction with the SiC crystals. The clips 317 may also be configured to decrease the masked area of the wafer 315, allowing for more uniform ion implantation. For example, the clips 317 may be wire clips having a diameter of less than about 0.5 mm, for instance, 0.2 mm.

Referring to FIG. 3A, during ion implantation, the wafer holding plate 310 may be oriented substantially vertically, such that the semiconductor wafer 315 may slide off the wafer holding plate 310 if not sufficiently secured. To secure the semiconductor wafer 315 to the wafer holding plate 310 in such an orientation, at least two clips 317 may be required. More particularly, the wafer holding plate 310 may include first and second holes 319x and 319y adjacent a circumference 320 of the semiconductor wafer 315 and separated by less than about 180° relative to a center of the semiconductor wafer 315. As such, two clips 317 respectively extending from the first and second holes 319x and 319y in the wafer holding plate 310 may sufficiently secure the semiconductor wafer 315 to the wafer holding plate 310 for use in the substantially vertical orientation.

However, the semiconductor wafer 315 may be more securely attached to the wafer holding plate 310 using at least three clips 317, as illustrated in FIG. 3B. More particularly, first and second holes 319a and 319b may be provided in the wafer holding plate adjacent the circumference 320 of the semiconductor wafer 315 and separated by about 180° relative to the center of the semiconductor wafer 315, while a third hole 319c adjacent the circumference of the semiconductor wafer 315 may be provided between the first and second holes 319a and 319b and respectively separated from the first and second holes 319a and 319b by about 90° relative to the center of the semiconductor wafer 315. As such, three clips 317 respectively extending from the first, second, and third holes 319a, 319b, and 319c in the wafer holding plate 310 may be used to sufficiently secure the semiconductor wafer 315 to the wafer holding plate 310 during the ion implantation process, and during loading and/or unloading of the wafer holding plate 310 from the load lock chamber into the ion implantation target chamber. The wafer holding plate 310 may also include a keyhole (not shown) at one end thereof that is adapted to matably interface with a loading assembly that is configured to load the wafer holding plate into the ion implantation target chamber, as discussed above with reference to FIG. 2B.

Moreover, while FIGS. 3A and 3B respectively illustrate the use of two clips and three clips to removably attach the semiconductor wafer 315 to the wafer holding plate 310, it is to be understood that a greater number or a fewer number of clips 317 may be used. Also, although described above primarily with respect to a vertical orientation of the wafer holding plate 310 during ion implantation, it should be noted that the wafer holding plate 310 may be oriented vertically or at any other angle to the ion beam during the ion implantation process.

Figure 4A:
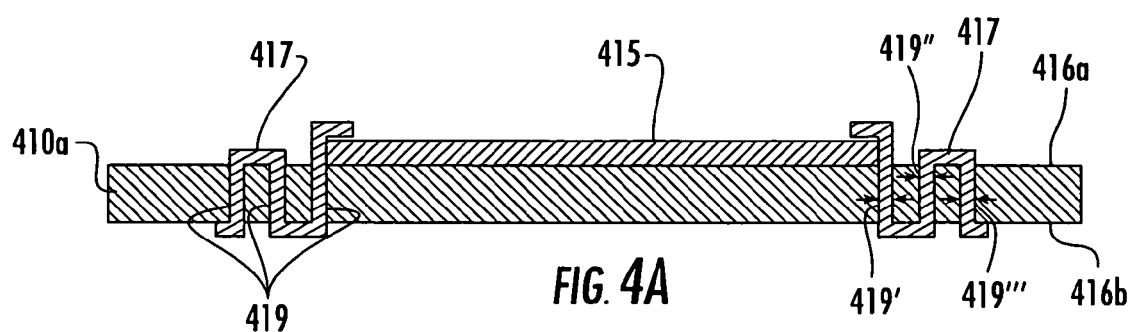
FIG. 4A is a cross-sectional view taken along line 4A-4A' of FIG. 3B illustrating a wafer holding plate according to some embodiments of the present invention.

FIG. 4A is a cross-sectional view taken along line 4A-4A' of FIG. 3B illustrating a wafer holding plate 410a according to some embodiments of the present invention. The wafer holding plate 410a may correspond to one of the wafer plates 110 illustrated in FIGS. 1A-1D. As shown in FIG. 4A, the wafer holding plate 410a includes a plurality of holes 419 adjacent a perimeter 420 of the semiconductor wafer 415 thereon. The clips 417 respectively extend from the holes 419. For example, the clips 417 may be a plurality of wire clips that are configured to be threaded through the holes 419 to secure the wire clips to the wafer holding plate 410a. At least two holes 419 may be provided for each of the clips 417. More particularly, as illustrated in FIG. 4A, three holes 419', 419", and 419''' are provided in the wafer holding plate 410a for each clip 417. As mentioned above, the clips 417 may be tantalum (Ta) wire clips having a diameter of less than about 0.5 mm. As such, each clip 417 may be threaded from a front side 416a of the wafer holding plate 410a through the hole 419' to the backside 416b of the wafer holding plate 410a, through hole 419" back to the front side 416a of the wafer holding plate 410a, and through hole 419'" again to the backside 416b of the wafer holding plate 410a to secure the clip 417 in place. Accordingly, the semiconductor wafer 415 may be securely but removably attached to the wafer holding plate 410 by the clips 417. In addition, as the clips 417 are relatively small (for example, 0.2 mm) in diameter, a relatively small area of the semiconductor wafer 415 may be masked during the ion implantation process.

Figure 4B:
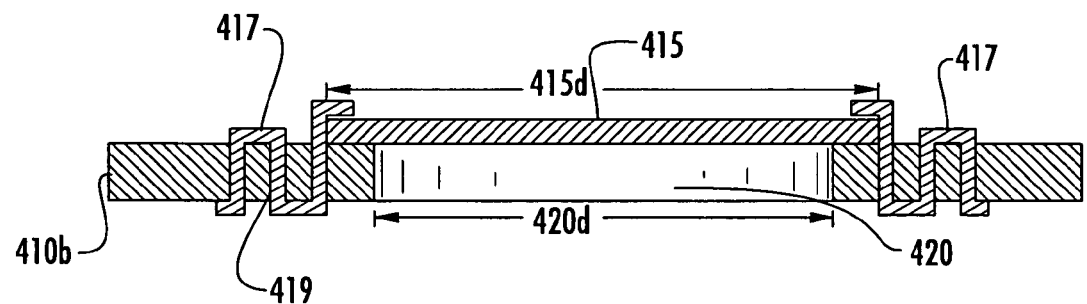
FIG. 4B is a cross-sectional view of a wafer holding plate according to further embodiments of the present invention.

FIG. 4B is a cross-sectional view illustrating a wafer holding plate 410b according to further embodiments of the present invention taken along the same section as for wafer holding plate 410a. Referring now to FIG. 4B, the wafer holding plate 410b includes an opening 420 extending through the wafer holding plate 410b beneath the semiconductor wafer 415 thereon. The semiconductor wafer 415 is secured to the wafer holding plate 410b by clips 417, as described above with reference to FIG. 4A. The opening 420 has at least one dimension that is smaller than that of the semiconductor wafer 415. More particularly, the opening 420 in the wafer holding plate 410b has a diameter 420d that is less than but substantially similar to a diameter 415d of the semiconductor wafer 415. The opening 420 in the wafer holding plate 410b is sized and configured to allow direct heating of the semiconductor wafer 415 through the opening 420. For example, a heating element, such as the heating element 145 of FIGS. 1A-1D, may be located beneath the wafer holding plate 410b when loaded in the ion implantation chamber, and may thereby directly heat the semiconductor wafer 415 through the opening 420 during the ion implantation process. As such, a surface temperature of the semiconductor wafer 415 may be directly adjusted during the ion implantation process, for example, responsive to measuring a thermal emissivity of the semiconductor wafer 415 through a window in the ion implantation target chamber, as described above with reference to FIGS. 1A-1D. Thus, the opening 420 in the wafer holding plate 410b may allow for improved and/or optimized conditions for ion implantation into the semiconductor wafer 415.

Figure 5A:
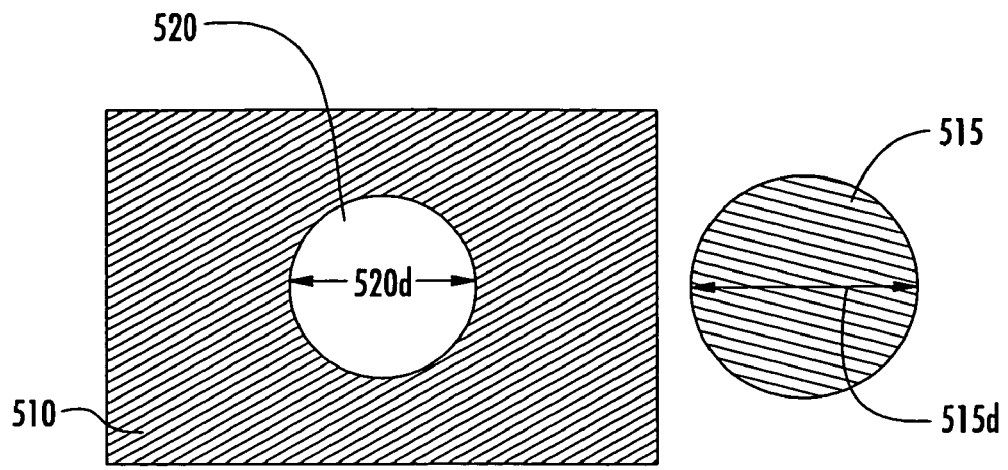
FIGS. 5A-5C are plan views illustrating apparatus and methods for heating a semiconductor wafer that is attached to a wafer holding plate according to some embodiments of the present invention.
Figure 5B:
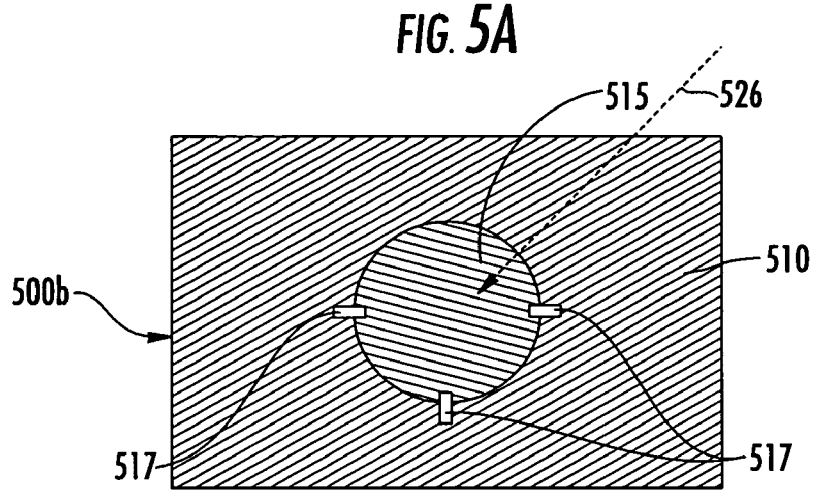
Figure 5C:
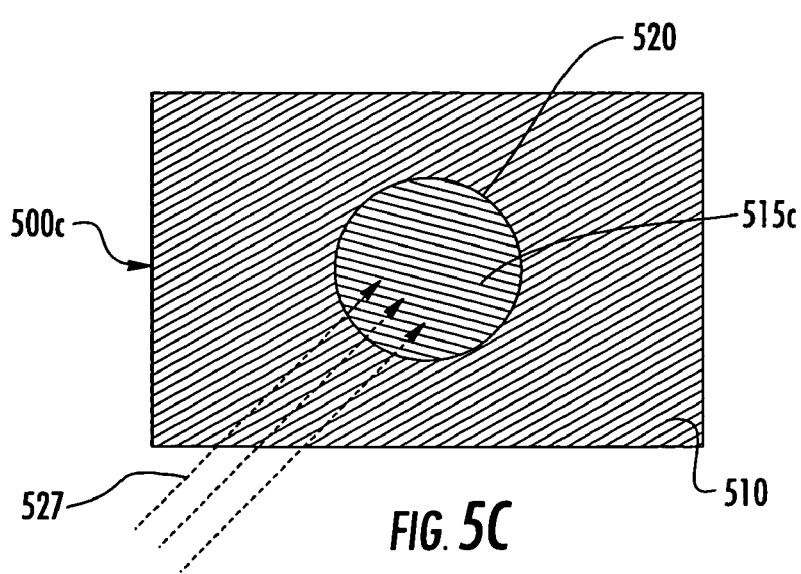

FIGS. 5A-5C further illustrate apparatus and methods for fabricating semiconductor devices according to some embodiments of the present invention. Referring now to FIG. 5A, a quartz wafer holding plate 510 includes an opening 520 extending therethrough near the center of the quartz plate 510. The opening 520 has a diameter 520d that is less than but substantially similar to a diameter 515d of a semiconductor wafer 515 that will be attached to the quartz wafer holding plate 510 for ion implantation. FIG. 5B illustrates a front side 500b of the quartz wafer holding plate 510. As shown in FIG. 5B, the semiconductor wafer 515 is concentrically placed over the opening 520 on the front side 500b of the quartz wafer plate 510, and is removably attached to the quartz wafer holding plate 510 by three wire clips 517. The wire clips 517 are threaded through a plurality of holes in the quartz wafer holding plate 510 adjacent a circumference of the wafer 515 to securely hold the semiconductor wafer 515 on the wafer holding plate 510 during the ion implantation process. As such, the semiconductor wafer 515 may be implanted via an ion beam, as shown by arrow 526. A greater number or a fewer number of wire clips 517 may be used to attach the semiconductor wafer 515 to the quartz wafer holding plate 510, depending on an orientation of the quartz wafer holding plate 510 during the ion implantation process.

FIG. 5C illustrates a back side 500c of the quartz wafer holding plate 510. As shown in FIG. 5C, the opening 520 in the quartz wafer holding plate 510 is sized and configured to allow direct heating of the semiconductor wafer 515 through the opening 520. More particularly, a back side 515c of the semiconductor wafer 515 is heated through the opening 520 in the back side 500c of the quartz wafer holding plate 510 during the ion implantation process, as shown by arrows 527. As such, the semiconductor wafer 515 may be heated to a desired temperature more quickly, which may allow faster wafer-to-wafer cycle time in semiconductor device fabrication.

Figure 6:
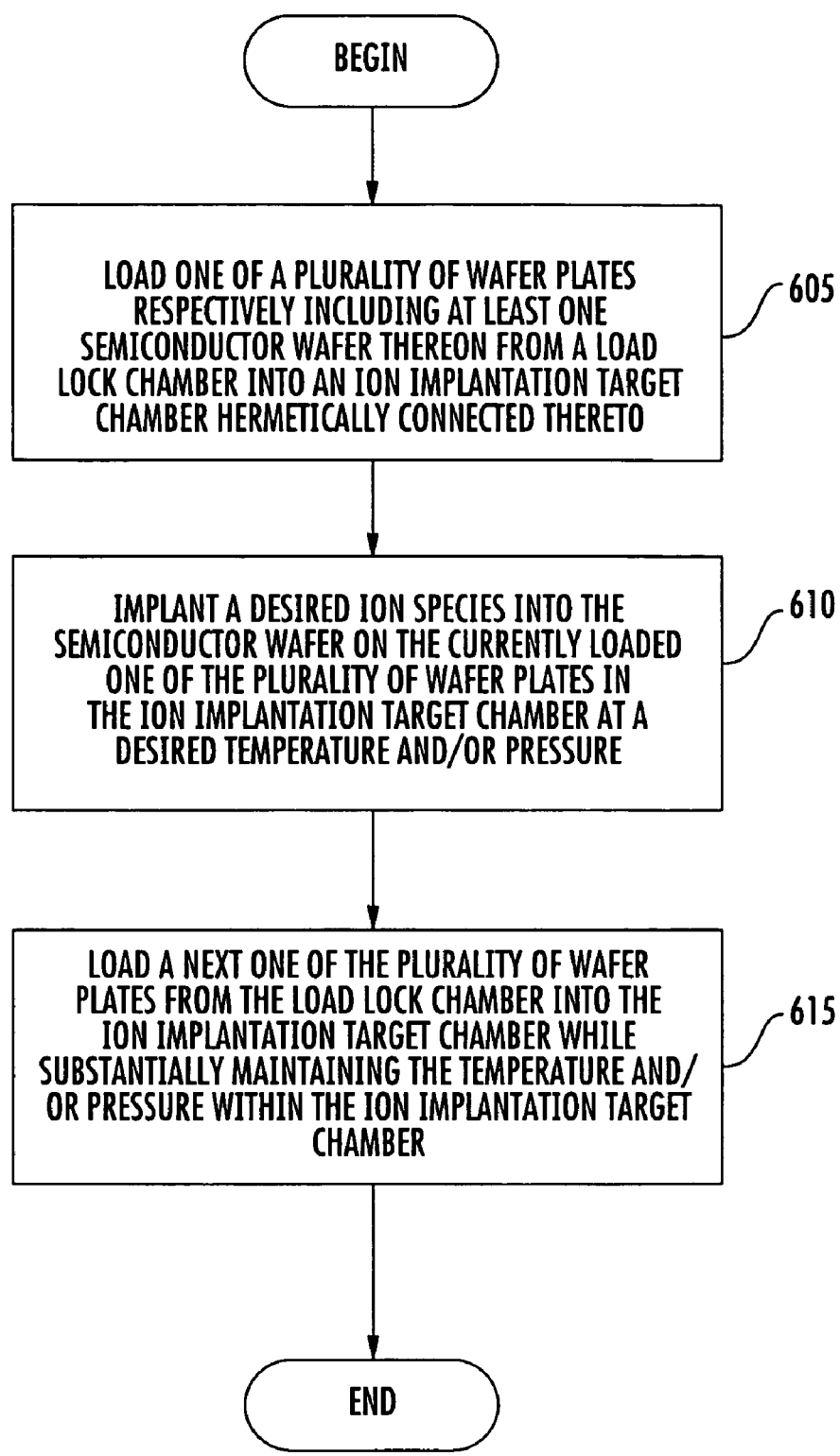
FIG. 6 is a flowchart illustrating exemplary operations for fabricating semiconductor devices using high-temperature ion implantation according to some embodiments of the present invention.

FIG. 6 is a flowchart illustrating exemplary fabrication operations in methods of fabricating a semiconductor device according to some embodiments of the present invention. Referring now to FIG. 6, operations begin at Block 605 when one of a plurality of wafer plates is loaded from a load lock chamber into an ion implantation target chamber that is hermetically connected to the load lock chamber. Each wafer plate may include at least one semiconductor wafer removably attached to the wafer plate. After loading the wafer plate into the ion implantation target chamber, a semiconductor wafer on the currently loaded wafer plate may be heated through an opening in the currently loaded wafer plate beneath the semiconductor wafer. For example, the semiconductor wafer on the currently loaded wafer plate may be heated to a desired surface temperature through the opening by a heating element in the ion implantation target chamber beneath the wafer plate. The surface temperature of the semiconductor wafer on the currently loaded wafer plate may be determined based on a thermal emissivity of the semiconductor wafer. More specifically, a thermal emissivity of the semiconductor wafer on the currently loaded wafer plate may be measured through a calcium fluoride ($CaF_2$) window in the ion implantation target chamber, for example, using infrared light in a range of up to about an 8 micron wavelength. The measured thermal emissivity correlates to a current surface temperature of the semiconductor wafer on the currently loaded wafer plate. As such, the semiconductor wafer on the currently loaded wafer plate may be heated to a desired surface temperature that may be suitable for ion implantation therein.

At Block 610, a desired ion species is implanted into the semiconductor wafer on the currently loaded one of the plurality of wafer plates at a desired temperature and/or pressure. More particularly, the desired ion species may be implanted into the semiconductor wafer on the currently loaded wafer plate in a vacuum, and at a temperature based on the ion species to be implanted and/or composition of the semiconductor wafer. Responsive to implantation of the desired ion species, the currently loaded wafer plate may be unloaded from the ion implantation target chamber back into the load lock chamber while substantially maintaining the current temperature and/or pressure of the ion implantation target chamber. For example, the currently loaded wafer plate may be unloaded by a loading assembly that is inside the hermetically connected load lock chamber, so that the wafer plate may be unloaded without cooling and/or venting ion implantation target chamber. In addition, one or more of the plurality of wafer plates in the load lock chamber may be pre-heated to a predetermined temperature as may be needed to reduce and/or avoid thermal shock during loading into the ion implantation target chamber. For example, the load lock chamber may include a heating element configured to pre-heat the next wafer plate and/or the plurality of wafer plates. Also, one or more of the plurality of wafer plates may be pre-heated based on the heating element in the ion implantation target chamber. For instance, the next wafer plate to be loaded may be pre-heated by infrared radiation from the heating element emitted through the connection point between the load lock chamber and the ion implantation chamber.

Still referring to FIG. 6, a next one of the plurality of wafer plates is loaded from the load lock chamber into the ion implantation target chamber at Block 615. The next wafer plate may be loaded into the ion implantation target chamber while substantially maintaining a current temperature within the ion implantation target chamber and/or without depressurizing the ion implantation target chamber. As such, the plurality of wafer plates stored in the load lock chamber may be consecutively loaded into the ion implantation target chamber for ion implantation without cooling and/or venting the chamber between the loading and/or unloading of each wafer plate, thereby increasing the throughput of the fabrication process. In addition, a first desired ion species may be implanted into the semiconductor wafer on a currently loaded wafer plate at a first temperature and/or pressure, while a second different ion species may be implanted into a semiconductor wafer on the next wafer plate at a different temperature and/or pressure responsive to loading the next wafer plate into the ion implantation target chamber. As such, the temperature and/or pressure of the ion implantation target chamber may be adjusted based on the wafer to be implanted and/or the desired ion species as the next wafer plate is loaded.

Accordingly, some embodiments of the present invention provide apparatus and methods for consecutively loading wafer plates from a load lock chamber into an ion implantation target chamber while substantially maintaining a current temperature and/or pressure of the ion implantation target chamber. As such, ion implantation may be performed without ramping the temperature and pressure of the target chamber up and down between the loading and unloading of each wafer plate. Accordingly, throughput of the ion implantation apparatus may be increased, and the efficiency of the fabrication process may be improved.

In the drawings and specification, there have been disclosed typical embodiments of the invention, and although specific terms are employed, they are used in a generic and descriptive sense only and not for purposes of limitation, the scope of the invention being set forth in the following claims.

That which is claimed:

1. A semiconductor device fabrication apparatus, comprising:
   a load lock chamber configured to store a plurality of wafer plates therein, the plurality of wafer plates respectively including at least one semiconductor wafer thereon, wherein at least one of the plurality of wafer plates includes an opening extending therethrough beneath the at least one semiconductor wafer thereon and having at least one dimension smaller than that of the at least one semiconductor wafer;
   an ion implantation target chamber hermetically connected to the load lock chamber and configured to implant an ion species into a semiconductor wafer on one of the plurality of wafer plates currently loaded therein; and
   a loading assembly in the load lock chamber configured to load a next one of the plurality of wafer plates from the load lock chamber into to the ion implantation target chamber, wherein the loading assembly includes an elongated arm having a key extending therefrom, and wherein the at least one of the plurality of wafer plates includes a key hole at one end thereof that is adapted to matably interface with the key of the loading assembly.

2. The apparatus of claim 1, wherein the loading assembly is further configured to unload the currently loaded one of the plurality of wafer plates from the ion implantation target chamber into the load lock chamber responsive to implantation of the ion species into the semiconductor wafer while substantially maintaining the temperature and/or pressure of the ion implantation target chamber.

3. The apparatus of claim 2, wherein the ion implantation target chamber is configured to implant a first desired ion species into the semiconductor wafer on the currently loaded one of the plurality of wafer plates, and to implant a second desired ion species into a semiconductor wafer on the next one of the plurality of wafer plates.

4. The apparatus of claim 1, further comprising:
   a cassette in the load lock chamber configured to hold the plurality of wafer plates; and
   a cassette advancing assembly in the load lock chamber configured to consecutively present the plurality of wafer plates to the loading assembly.

5. The apparatus of claim 4, wherein the cassette comprises a plurality of grooves configured to hold respective ones of the plurality of wafer plates, and wherein the plurality of grooves are coated with a reduced friction surface configured to facilitate loading and/or unloading of the plurality of wafer plates from the cassette.

6. The apparatus of claim 4, wherein the cassette advancing assembly comprises a cassette movement arm configured to move the cassette along a first axis to present a next one of the plurality of wafer plates to the loading assembly.

7. The apparatus of claim 6, wherein the loading assembly comprises an elongated loading arm configured to move along a second axis generally perpendicular to the first axis to load the next one of the plurality of wafer plates from the load lock chamber into to the ion implantation target chamber.

8. The apparatus of claim 7, wherein the load lock chamber includes a first elongated portion configured to house the elongated loading arm and a second elongated portion configured to house the cassette movement arm, and further comprising:
   at least one magnet outside the load lock chamber adjacent the first and/or second elongated portions thereof and configured to magnetically actuate the elongated loading arm and/or the cassette movement arm to induce movement thereof without depressurizing the ion implantation target chamber.

9. The apparatus of claim 1, wherein the load lock chamber is configured to pre-heat at least the next one of the plurality of wafer plates therein based on the current temperature of the reference point in the ion implantation target chamber to reduce and/or avoid thermal shock to the next one of the plurality of wafer plates.

10. The apparatus of claim 9, further comprising:
    a heating element in the load lock chamber configured to pre-heat one or more of the plurality of wafer plates based on the current temperature of the reference point in the ion implantation target chamber.

11. The apparatus of claim 1, wherein at least one of the plurality of wafer plates includes an opening extending therethrough beneath the at least one semiconductor wafer thereon, the opening having at least one dimension smaller than that of the at least one semiconductor wafer.

12. The apparatus of claim 11, wherein the at least one of the plurality of wafer plates further includes a plurality of holes adjacent a perimeter of the opening therein, and a plurality of wire clips respectively extending from ones of the plurality of holes and configured to removably attach the at least one semiconductor wafer thereto adjacent to the opening.

13. The apparatus of claim 11, further comprising:
a heating element in the ion implantation target chamber configured to heat a semiconductor wafer on one of the plurality of wafer plates currently loaded therein through the opening in the one of the plurality of wafer plates.

14. The apparatus of claim 1, wherein the elongated arm of the loading assembly is rotatable to lock the key extending therefrom into the key hole to secure the at least one of the plurality of wafer plates to the elongated arm to facilitate loading the at least one of the plurality of wafer plates into the ion implantation target chamber.

15. The apparatus of claim 1, further comprising:
a window on a wall of the ion implantation target chamber and having a transparency sufficient to allow measurement of a thermal emissivity of a semiconductor wafer on the currently loaded one of the plurality of wafer plates in the ion implantation target chamber.

16. The apparatus of claim 15, wherein the window comprises calcium fluoride ($CaF_2$) having a transparency with respect to infrared light in a range of up to about an 8 micron wavelength.

17. A semiconductor device fabrication apparatus, comprising:
a wafer holding plate configured to hold a semiconductor wafer thereon; and
a plurality of clips removably attached to the wafer holding plate and configured to removably attach the semiconductor wafer to the wafer holding plate,
wherein the wafer holding plate further comprises a key hole at one end thereof that is adapted to matably interface with a loading assembly that is configured to load the wafer holding plate into an ion implantation target chamber.

18. The apparatus of claim 17, wherein the wafer holding plate includes a plurality of holes therein adjacent a perimeter of the semiconductor wafer thereon, and wherein the plurality of clips respectively extend from ones of the plurality of holes.

19. The apparatus of claim 18, wherein the wafer holding plate comprises a first material, and wherein the plurality of clips comprise a second material having a greater flexibility than the first material.

20. The apparatus of claim 19, wherein the plurality of holes comprise at least two holes for each of the plurality of clips, and wherein the plurality of clips comprise a plurality of wire clips respectively configured to be threaded through the at least two holes to secure the plurality of wire clips to the wafer holding plate.

21. The apparatus of claim 19, wherein the plurality of clips are sized and configured to reduce thermal contact and/or chemical reaction with the semiconductor wafer.

22. The apparatus of claim 21, wherein the plurality of clips comprise a plurality of wire clips having a diameter of less than about 0.5 mm.

23. The apparatus of claim 21, wherein the plurality of clips comprise tantalum (Ta) wire clips.

24. The apparatus of claim 18, wherein the plurality of holes comprises first and second holes adjacent a circumference of the semiconductor wafer and separated by less than about 180 degrees relative to a center of the semiconductor wafer.

25. The apparatus of claim 18, wherein the plurality of holes comprises first and second holes adjacent a circumference of the semiconductor wafer and separated by about 180 degrees relative to a center of the semiconductor wafer, and a third hole adjacent the circumference of the semiconductor wafer between the first and second holes and respectively separated therefrom by about 90 degrees relative to the center of the semiconductor wafer.

26. The apparatus of claim 17, wherein the wafer holding plate further includes an opening extending therethrough beneath the semiconductor wafer, the opening having at least one dimension smaller than that of the semiconductor wafer.

27. The apparatus of claim 26, wherein the opening in the wafer holding plate is sized and configured to allow direct heating of the semiconductor wafer therethrough.

28. The apparatus of claim 26, wherein the opening in the wafer holding plate has a diameter that is less than but substantially similar to a diameter of the semiconductor wafer.

* * * * *